United States Patent
Morsey et al.

(10) Patent No.: US 10,254,784 B1
(45) Date of Patent: Apr. 9, 2019

(54) USING REQUIRED ARRIVAL TIME CONSTRAINTS FOR COUPLED NOISE ANALYSIS AND NOISE AWARE TIMING ANALYSIS OF OUT-OF-CONTEXT (OOC) HIERARCHICAL ENTITIES

(71) Applicant: International Business Machines Corporation, Armonk, NY (US)

(72) Inventors: Jason David Morsey, Hopewell Junction, NY (US); Steven Eugene Washburn, Poughquag, NY (US); Patrick M. Williams, Salt Point, NY (US); Michael Hemsley Wood, Wilmington, DE (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/044,485

(22) Filed: Jul. 24, 2018

(51) Int. Cl.
*G06F 1/10* (2006.01)
*H04B 3/487* (2015.01)
*H03K 19/003* (2006.01)

(52) U.S. Cl.
CPC ......... *G06F 1/10* (2013.01); *H03K 19/00346* (2013.01); *H04B 3/487* (2015.01)

(58) Field of Classification Search
USPC .................................................. 713/113, 115
See application file for complete search history.

(56) References Cited

U.S. PATENT DOCUMENTS

| | | | |
|---|---|---|---|
| 6,449,753 B1 | 9/2002 | Aingaran | |
| 6,510,540 B1 | 1/2003 | Krauter | |
| 7,698,674 B2 | 4/2010 | Kalafala | |
| 7,739,640 B2 | 6/2010 | Abbaspour | |
| 8,219,952 B2 | 7/2012 | Tehrani | |
| 8,468,479 B2 | 6/2013 | Tehrani | |
| 8,701,075 B2 | 4/2014 | Dartu | |
| 9,400,864 B2 | 7/2016 | Hathaway | |
| 9,542,524 B2 | 1/2017 | Gregerson | |
| 2017/0061067 A1 | 3/2017 | Gregerson | |

OTHER PUBLICATIONS

Chandu Visweswariah Tutorial 2, Within-Die Variations in Timing: From Derating to CPPR to Statistical Methods, IEEE/ACM International Conference on Computer-Aided Design Digest of Technical Papers, Nov. 5-8, 2007, San Jose, CA, slide 9.

*Primary Examiner* — Adam D Houston
(74) *Attorney, Agent, or Firm* — Erik Johnson; Otterstedt, Ellenbogen & Kammer, LLP (57) ABSTRACT

Coupled noise from at least one out-of-context aggressor net of an integrated circuit design is computed for an out-of-context victim net. The nets are out-of-context with respect to a hierarchical noise analysis of the integrated circuit design. At least one of the nets is a continuation of a path which extends to at least one in-context portion of the integrated circuit design. An aggressor signal timing window is derived for the at least one out-of-context aggressor net; a victim signal timing window is derived for the out-of-context victim net; and a timing window and noise analysis is completed with the aggressor signal timing window and the victim signal timing window. The aggressor window is derived as a function of required arrival time of the at least one out-of-context aggressor net and/or the victim window is derived as a function of required arrival time of the out-of-context victim net.

20 Claims, 8 Drawing Sheets

USING REQUIRED ARRIVAL TIME CONSTRAINTS FOR COUPLED NOISE ANALYSIS AND NOISE AWARE TIMING ANALYSIS OF OUT-OF-CONTEXT (OOC) HIERARCHICAL ENTITIES

BACKGROUND

The present invention relates to the design of integrated circuits (ICs), and more specifically, to timing analysis of such circuits.

Generally, ICs have data signals and a clock; the data signal needs to reach a certain node at the correct time vis-a-vis the time when the corresponding clock cycles the device at that node. If the data signal does not arrive in time, the clock is too fast, or alternatively, the data signal is taking too long to propagate (path is too slow).

Coupled noise on a chip is when unwanted energy is transferred from one net (connection between two or more pins) to another net by means of coupled electric/magnetic fields. The net which is receiving the unwanted energy is commonly labeled the victim net, while the net(s) transmitting the unwanted energy are commonly labeled the aggressor net(s). The coupled noise is typically represented as a voltage signal (or multiple signals if there are multiple aggressors) existing on the victim net in addition to the desired/intended signal which was generated by the victim driver. The combination of the victim signal and the aggressor signal(s) represents the total voltage signal on the victim net as seen by the devices connected to the end of the net.

Signals traveling down the aggressor nets at or around the same time as the victim signal can cause unwanted changes in behavior in the devices connected to the victim net, due to the transfer of energy to the victim via the coupled noise. A common example of this pertinent to aspects of the invention is when the coupled noise increases the charge time, and thus the effective delay, of a receiver at the end of the victim net, causing the victim path to fail hardware timing specs (specifications). For example, the coupled noise may increase the charging time of a gate on the data path, causing the data path to be slower, and then producing a condition where the data signal does not arrive on time. The "correct time" mentioned above can also be referred to as the "hardware timing specs" or the "required arrival time" of the data signal. When the slow-down due to noise causes the data to arrive late, specifically later then the required arrival time, this is referred to as a "failure."

State of the art prediction of coupled noise involves using the relative timing of all aggressor nets with respect to the victim net. In this way, it is possible to determine which aggressor nets do have the potential to affect the victim timing, which aggressor signals will arrive too early/late to affect the victim timing, and which of these aggressor nets can affect the victim simultaneously.

The range of time representing the potential arrival of noise from each aggressor is commonly labeled the aggressor window, while the range of time representing when the victim signal is susceptible to influence from noise, for example when the receiver could be charging, is commonly labeled the victim window.

Consider now out-of-context hierarchical noise analysis. Often in the analysis of large hardware, the hardware is dissected into smaller pieces or subsets of the design. This is done from both an ease of design point of view and an ease of analysis point of view, in order to make things more manageable. Often smaller subsets are nested inside larger subsets in a hierarchical manner.

When analyzing the higher-level subset of the design, the lower level out-of-context or OOC subset will appear to the higher-level subset of the design as a "black box." When analyzing lower level hierarchical subsets of the design, the original launch time of victim and/or aggressor signals, and therefore the arrival times used to create victim/aggressor windows, may not be known. If the signal on an aggressor started from a point outside, or higher in the hierarchy than, the subset of the design being analyzed, that launch point is outside the scope of the analysis. The estimated/assumed signal arrival times that are used instead are commonly labeled as asserted arrival times.

These asserted arrival times cause uncertainty in the windows, and result in over estimates of the impact of coupled noise in order to safe guard around errors in the asserted arrival time values. The data outside the scope of the current analysis, used to set the asserted arrival times, may not be completely trusted. The design outside the scope of the current analysis may be partially unknown or subject to change, and thus the arrival times may change after the OOC analysis/design has been completed. The current design may be used (copied) in multiple locations across the larger hardware design, so the true arrival times may vary depending on where each use/copy of the current design is located.

SUMMARY

Principles of the invention provide techniques for using required arrival time constraints for coupled noise analysis and noise aware timing analysis of out-of-context (OOC) hierarchical entities. In one aspect, an exemplary method includes computing, for an out-of-context victim net of an integrated circuit design, coupled noise from at least one out-of-context aggressor net of the integrated circuit design. The out-of-context victim net and the at least one out-of-context aggressor net are out-of-context with respect to a hierarchical noise analysis of the integrated circuit design. At least one of the out-of-context victim net and the at least one out-of-context aggressor net is a continuation of a path which extends to at least one in-context portion of the integrated circuit design. Further steps include deriving, for the at least one out-of-context aggressor net, an aggressor signal timing window; deriving, for the out-of-context victim net, a victim signal timing window; and completing a timing window and noise analysis with the aggressor signal timing window and the victim signal timing window. the aggressor signal timing window is derived as a function of required arrival time of the at least one out-of-context aggressor net and/or the victim signal timing window is derived as a function of required arrival time of the out-of-context victim net.

In another aspect, an exemplary apparatus includes a memory; and at least one processor, coupled to the memory. The at least one processor is operative to compute, for an out-of-context victim net of an integrated circuit design, coupled noise from at least one out-of-context aggressor net of the integrated circuit design. The out-of-context victim net and the at least one out-of-context aggressor net are out-of-context with respect to a hierarchical noise analysis of the integrated circuit design. At least one of the out-of-context victim net and the at least one out-of-context aggressor net is a continuation of a path which extends to at least one in-context portion of the integrated circuit design. The at least one processor is further operative to derive, for the at least one out-of-context aggressor net, an aggressor signal timing window; derive, for the out-of-context victim net, a victim signal timing window; and complete a timing window and noise analysis with the aggressor signal timing window and the victim signal timing window. The aggressor signal timing window is derived as a function of required arrival time of the at least one out-of-context aggressor net and/or the victim signal timing window is derived as a function of required arrival time of the out-of-context victim net.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

better estimate of the signal timing windows, and thus a better estimate of the coupled noise;

better performance of resulting integrated circuit chips;

improved performance of a computer carrying out electronic design analysis (EDA) by removing the need to re-run the simulations when the arrival time (AT) changes—in one or more embodiments, the AT changes but the required arrival time (RAT) does not—performance is improved as there is no need to rerun the analysis when the AT for the in-context portion changes.

These and other features and advantages of the present invention will become apparent from the following detailed description of illustrative embodiments thereof, which is to be read in connection with the accompanying drawings.

DETAILED DESCRIPTION

Figure 1:
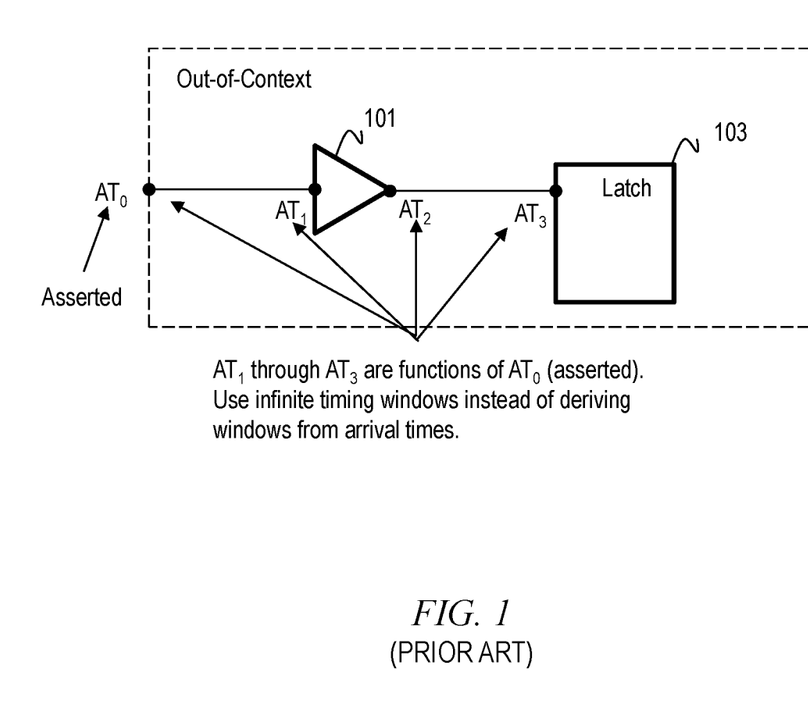
FIG. 1 shows an exemplary layout with derivation of arrival times in accordance with the prior art.

One or more embodiments advantageously improve the accuracy of coupled noise analysis when using timing windows based on asserted arrival times. Referring now to FIG. 1, the current state of the art when dealing with asserted arrival times is to either (i) use the asserted value as if it were correct, which exposes the hardware to errors in the coupled noise prediction; or (ii) do not use the asserted arrival time, and assume the signal could arrive at any time (the latter is commonly referred to as an infinite window). FIG. 1 shows a sample layout including a buffer 101 and latch 103. The arrival times (AT) are shown as derived from the initial asserted arrival time.

Figure 2:
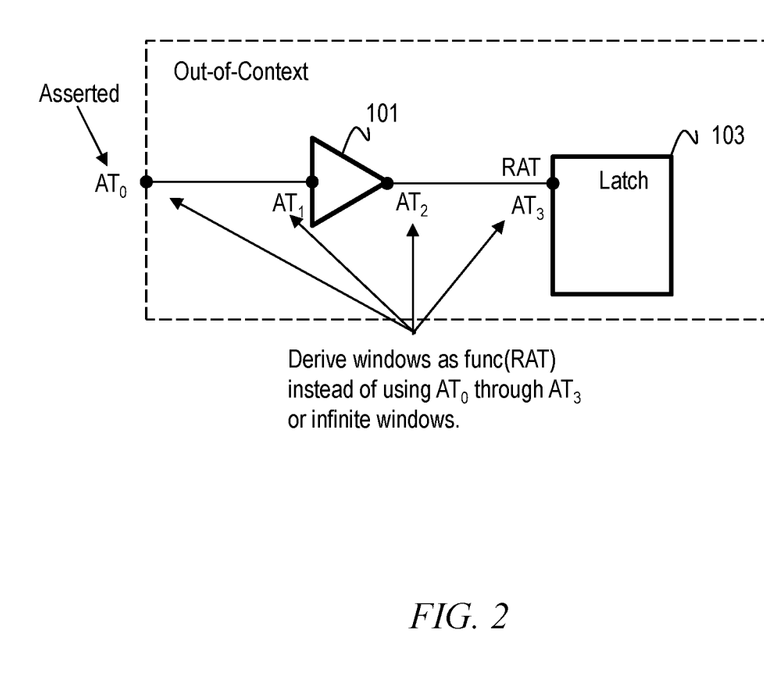
FIG. 2 shows an exemplary layout with the uncertainty in the coupled noise analysis reduced by creating a timing window from the Required Arrival Time (RAT) instead of arrival time (AT), according to an aspect of the invention.

Referring now to FIG. 2, for the same sample layout as FIG. 1, reduce the uncertainty in the coupled noise analysis by creating a timing window from the Required Arrival Time (RAT) instead of the (asserted) arrival time (AT). The RAT is in the scope of the out-of-context environment, and therefore a timing window based on RAT removes the uncertainty. FIG. 2 thus shows, in the context of the sample layout, the Required Arrival Time (RAT), and locations where a RAT-based window can be applied. The windows are derived as a function of RAT (func(RAT)) instead of using $AT_0$ through $AT_3$ or infinite windows. As noted, the uncertainty in FIG. 2 is reduced as compared to FIG. 1; it is still not known when the signal will arrive, but the uncertainty has been reduced by narrowing down to a range of valid arrival times.

One or more embodiments advantageously provide a better estimate of the signal timing windows, and thus a better estimate of the coupled noise, by basing these windows on the timing specs (required arrival times) at points that are inside the scope of the analysis, as opposed to the state of the art, which bases the windows on asserted arrival times that are outside the scope of the analysis. For example, it is possible to use the timing specifications (specs) to determine the earliest and latest possible arrival times for the signal that will not cause a failure in any of the hardware. These earliest/latest possible arrival times are commonly referred to as the required arrival time. If the signal arrives any earlier than the minimum required arrival time, the hardware won't meet timing specs, so it can reasonably be assumed this won't happen (i.e. won't meet timing specs) even if the higher level hierarchical design is later changed, since the RAT-based window focuses on the requirements of the portion inside the scope of the analysis. Furthermore in this regard, one or more embodiments assume that the design will not be changed such that the RAT is not satisfied. The idea is that it is not known how the higher-level design is going to change. However, it can be assumed that any change on the higher-level design will have to honor the RAT. Thus, the RAT produces a range of arrival times, and it is assumed that any design change outside the scope of this analysis can only produce arrival times within that range. Using the RAT-based windows means that one is designing the lower-level hierarchy to meet ALL possible arrival times of the higher-level hierarchy, assuming the higher-level honors the required arrival times. Stated differently, the RAT gives one all possible asserted arrival times, since one knows any time earlier than some time ATearly will cause a RAT violation and any time later than some time ATlate will cause a RAT violation. Similarly, consider the case of the signal arriving any later than the maximum required arrival time—the hardware won't meet timing specs either—so it can again reasonably be assumed this won't happen even if the higher level hierarchical design is later changed. That is to say, again assume no changes will be made in the design that would cause the RAT not to be satisfied.

As used herein, the "required arrival time (RAT)" refers to a time associated with each node wherein the late required arrival time means that this is the latest time at which the signal is allowed to switch to satisfy all tests fed by this signal (the larger the better) while the early required arrival time means that this is the earliest time at which the signal is allowed to switch (the smaller the better). Refer to Chandu Visweswariah—IBM Thomas J. Watson Research Center, Yorktown Heights, NY, TUTORIAL 2, WITHIN-DIE VARIATIONS IN TIMING: FROM DERATING TO CPPR TO STATISTICAL METHODS, IEEE/ACM International Conference on Computer-Aided Design Digest of Technical Papers, Nov. 5-8, 2007, San Jose, Calif., slide 9 thereof, hereby expressly incorporated herein by reference in its entirety for all purposes.

The just-described approach advantageously results in smaller windows compared to infinite windows (as in some prior art approaches), and therefore less coupled noise estimate, as compared to the infinite windows described previously. The just-described approach advantageously results a better window compared to simply trusting the asserted arrival times, since trusting the asserted value may lead to inaccurate prediction of noise and unanticipated hardware failures.

Figure 3:
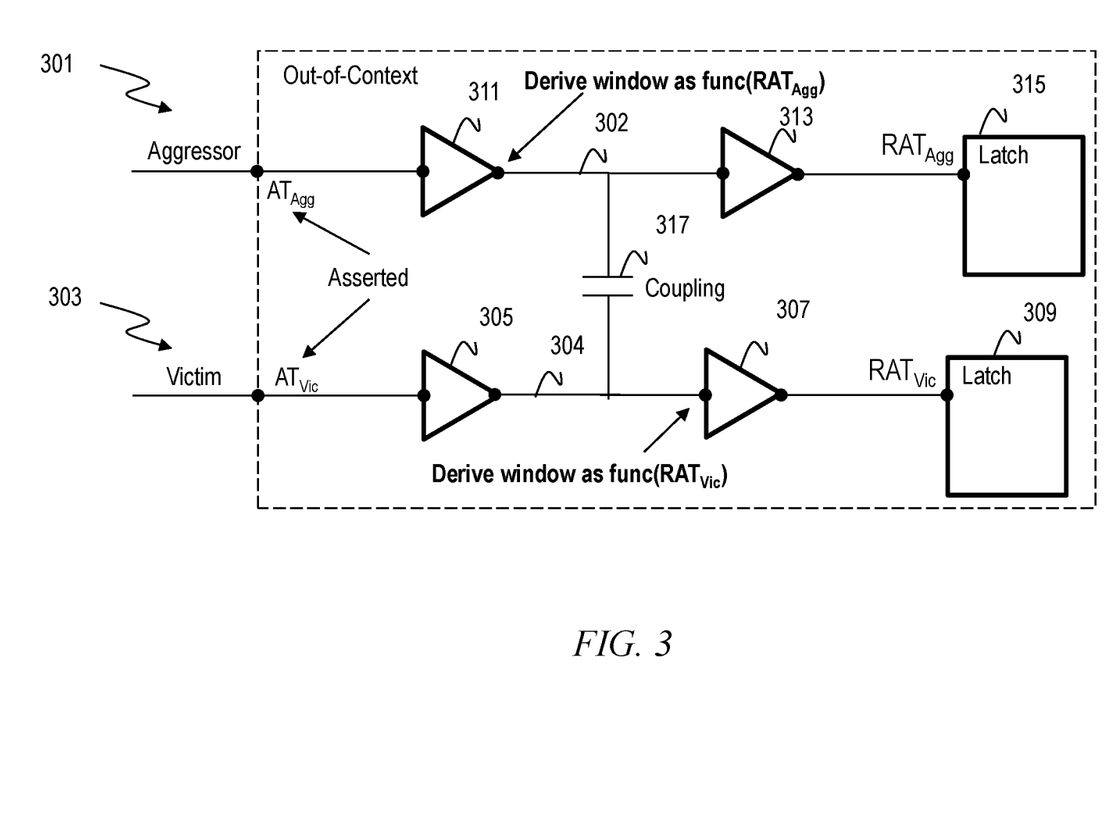
FIG. 3 shows an exemplary layout identifying the location of an aggressor and a victim window based on the RAT, according to an aspect of the invention.

FIG. 3 illustrates a sample layout identifying the location of an aggressor window and a victim window based on the RAT. Elements 301 and 303 are in-context paths associated with, respectively, an out-of-context aggressor net 302 and an out-of-context victim net 304. The "victim" layout includes buffers 305, 307 and latch 309. The "aggressor" layout includes buffers 311, 313 and latch 315. Capacitive coupling is shown at 317. One or more embodiments start with computed values for the possible effects of each aggressor signal acting on a victim signal. In other words, one or more embodiments use existing state of the art techniques to compute each aggressor's coupled noise. The aggressor (noise) signal timing windows are derived as a function of the required arrival times. As an example, the aggressor timing window could be the range of the earliest to latest possible arrival times which satisfy the RAT ($RAT_{Agg}$ as given in the figure). The victim signal timing window is derived as a function of the required arrival times. As an example, start with the earliest to latest possible arrival times which satisfy the RAT ($RAT_{vic}$ in the figure). The victim timing window could be centered on the worst case possible arrival time within this range. The window/noise analysis is then completed using the aggressor (noise) signal timing windows derived as a function of the required arrival times and/or the victim signal timing window derived as a function of the required arrival times, using known techniques. Regarding a non-limiting example of such known techniques, refer to Krauter et al., Windowing mechanism for reducing pessimism in cross-talk analysis of digital chips, U.S. Pat. No. 6,510,540, hereby expressly incorporated herein by reference in its entirety for all purposes. Krauter et al. presents the idea of window analysis. One or more embodiments use such windowing with the specific improved windows described herein.

Figure 4A:
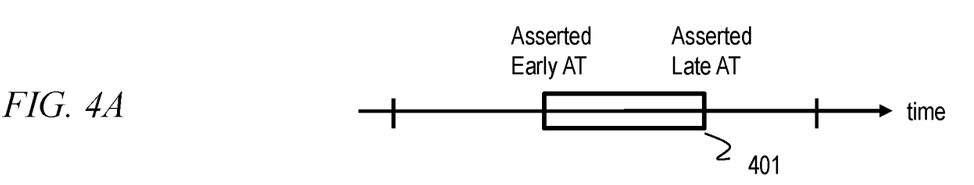
FIGS. 4A and 4B, collectively referred to as FIG. 4, illustrate (FIG. 4A) an aggressor timing window based on asserted arrival times (AT), and (FIG. 4B) one possible timing window as a function of required arrival times (RAT), according to an aspect of the invention.
Figure 4B:
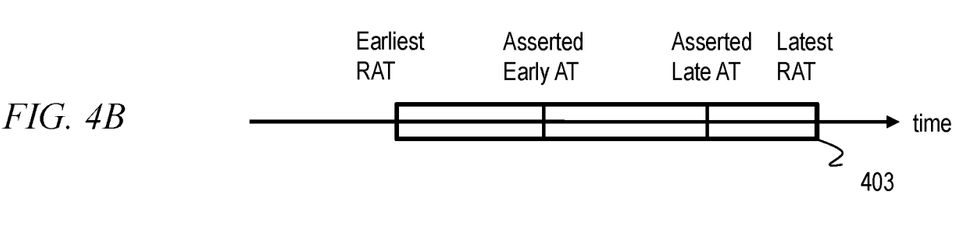

Refer now to FIGS. 4A and 4B, regarding derivation of the aggressor (noise) signal timing windows as a function of the required arrival times. The aggressor window is the range of earliest to latest possible arrival times of the unwanted aggressor signal, and is typically specified at the aggressor's driver pin or at the victim pin where noise is being computed, such as the victim's receiver input pin. If the arrival time is based on asserted values, it is unreliable and/or subject to change. One or more embodiments advantageously use the required arrival times of the aggressor net to derive a range of possible arrival times of the aggressor, which will not be based on asserted values. For example, the aggressor's window could be the range of arrival times such that the aggressor meets the required arrival times as specified by the timing specs for the hardware. In this way, the aggressor window will be larger than it would be if using the unreliable asserted arrival times, but is the smallest window that will cover all practical arrival times.

FIG. 4A shows an aggressor timing window based on asserted arrival times (AT). The right-hand edge of the window is the asserted late AT, and the left-hand edge of the window is the asserted early AT. FIG. 4B shows one possible timing window 403 as a function of required arrival times (RAT). The right-hand edge of the window is the latest RAT, and the left-hand edge of the window is the earliest RAT. The asserted early AT and asserted late AT of FIG. 4A are located within window 403.

Figure 5A:
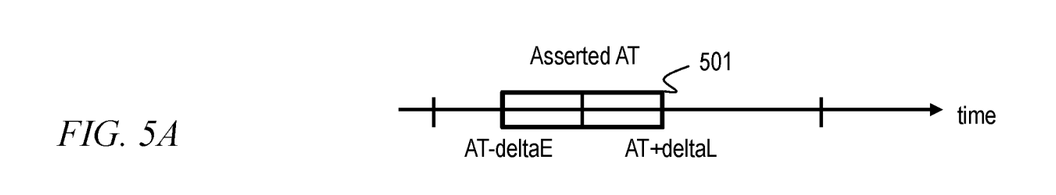
FIGS. 5A, 5B, and 5C, collectively referred to as FIG. 5, illustrate (FIG. 5A) a victim timing window based on asserted arrival times (AT), (FIG. 5B) a range of possible victim arrival times based on required arrival times, and (FIG. 5C) one possible victim timing window based on a specific choice of AT within this range), according to an aspect of the invention.
Figure 5B:
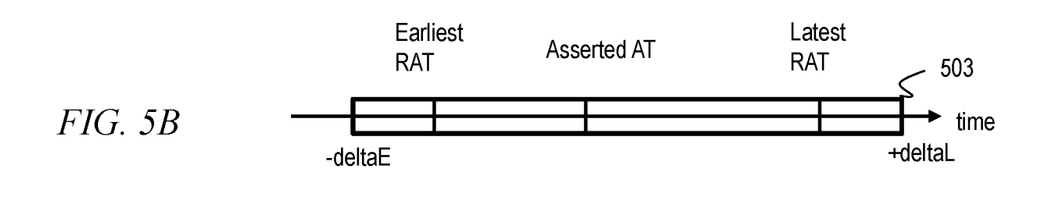
Figure 5C:
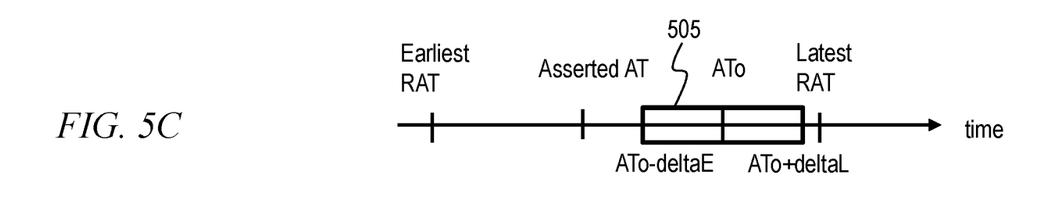

Refer now to FIGS. 5A, 5B, and 5C, regarding derivation of the victim signal timing window as a function of the required arrival times. The victim window is the range of time around the victim arrival time where the victim is susceptible to being influenced by noise. For example, assume it is desired to compute the coupled noise effects at the input to a device on the victim net. The victim window is the range of time where the aggressor noise could potentially cause the device to behave differently on that victim signal. This ranges from some period of time preceding (i.e., coming before) the victim signal, to some period of time following the victim signal. Refer to deltaE and deltaL. Basically, noise could arrive a time deltaE before the victim and still influence the device's behavior on the victim signal. Likewise, the noise could arrive a time deltaL after the victim and still have an influence on the device's behavior on the victim signal. Thus, the entire range of time the device might be susceptible to noise is Earliest RAT−deltaE to Latest RAT+deltaL (referring to FIG. 5B). FIG. 5A shows a victim timing window 501 based on asserted arrival times (AT). The nominal asserted AT is the midpoint of the window 501; the left-hand edge is the nominal value less deltaE, while the right-hand side is the nominal value plus deltaL. Noise may arrive deltaE before the victim signal and still have influence. Likewise, noise could arrive deltaL after the victim signal and still have an influence. Thus, the victim window is the range of time when the victim device is susceptible to noise, which is AT−deltaE to AT+deltaL. In a more hardware-related explanation/example, the victim signal arrives at the input to the device, with the desire to make the device switch. The device starts to charge up and switch, but before it can complete the process of switching, the aggressor noise signal arrives and disrupts the switching of the device. Technically, the aggressor signal arrived after the victim had already arrived. However, the aggressor signal arrived before the device had time to fully switch, so the noise will still cause the device to slow down and take longer to switch. DeltaL is the amount of time following the victim signal during which it is required to be noise free to be sure the device has time to fully switch. DeltaE is the amount of time during which it is required to be noise free before the victim arrives, or the device will take longer to switch when the victim arrives.

If the victim signal's arrival time is based on asserted values, it is unreliable and/or subject to change. One or more embodiments use the required arrival times of the victim net to derive a new arrival time, which is not based on asserted values. One example of such a function involved using the required arrival times to determine the earliest and latest possible victim arrival times, such that the victim path meets the required arrival times of the hardware timing specs. One or more embodiments then determine the victim's arrival time in that range which causes the largest coupled noise; this becomes the new victim arrival time. FIG. 5B shows a window 503 with a range of possible victim arrival times based on required arrival times. The Asserted AT of FIG. 5A falls within the window 503, as do the earliest RAT and latest RAT. The left-hand edge is the earliest RAT less deltaE, while the right-hand edge is the latest RAT plus deltaL. FIG. 5C shows one possible victim timing window 505 based on a specific choice of AT ($AT_0$) within this range. The left-hand edge of window 505 is $AT_0$ less deltaE while the right-hand edge of window 505 is $AT_0$ plus deltaL. Note that "earliest possible AT" and "earliest RAT" essentially mean the same thing. Earliest possible AT is the AT that satisfies the earliest RAT. The victim's RAT provides a range of all possible arrival times of the victim (FIG. 5B), independent of the asserted arrival time. From this range, choose the arrival time for the victim (ATo), that produces a victim timing window (ATo−deltaE to ATo+deltaL), that in turn produces the most coupled noise. Since the victim could be any arrival time in this range, the safest choice is the one which produces the most coupled noise.

One or more embodiments thus provide techniques for estimating the potential impact of coupled noise analysis using timing specs (required arrival times). In one or more embodiments, compute the potential coupled noise for each aggressor signal on the victim signal. Derive coupled noise windows (aggressor windows) as a function of timing specs (required arrival times). Derive the victim window as a function of timing specs (required arrival times) at the point where coupled noise is to be computed on the victim signal. Complete the timing window analysis using the timing windows from the two previous steps.

In one or more embodiments, the aggressor windows are derived using required arrival times, but the victim window is not.

In some instances, only a subset of the aggressor windows are derived using required arrival times.

In one or more embodiments, the victim window is derived using required arrival times, but the aggressor windows are not.

In some instances, the aggressor window(s) are the range of earliest to latest possible arrival times that satisfy the required arrival times.

In some cases, the victim window is based on the worst-case arrival time within the range of earliest to latest possible arrival times that satisfy the required arrival times.

One or more embodiments advantageously provide techniques for directly dealing with the uncertainty in arrival times while keeping the upper level design unknown, as opposed to iterating and updating repeatedly on a known upper level design.

One or more embodiment use required arrival times, instead of true arrival times, to determine when a signal might couple from its path to another path. One non-limiting application of one or more embodiments is to replace the arrival time windows in the current techniques with required arrival time windows. One or more embodiments are used in connection with noise analysis.

Consider now benefits of one or more embodiments as compared to the prior art. One prior art technique uses "infinite windows." This essentially means that the signal (aggressor or victim) can arrive at any time. In essence, since it is not known when the signal can arrive (since it is based on asserted arrival times), assume the arrival time is −infinity to +infinity. Compared to this prior-art technique, one or more embodiments will predict a more accurate result that shows LESS coupled noise. This will prevent over-design, as the infinite window would have caused engineering changes to the hardware to fix false timing failures. This over-design leads to larger chip area being used, which leads to less functionality on a chip because area is a finite resource. This also leads to higher power usage by the chip.

Another state of the art technique is to do nothing, and just use the asserted arrival times as if they were guaranteed to be correct. This leads to under-predicting the noise, and would result in not predicting noise-related timing failures. This can lead to hardware being built which does not perform as desired, either in performance or in functionality.

Thus, one or more embodiments provide more accurate noise prediction, as compared to over-predicting or under-predicting the noise with another technique. Furthermore, one or more embodiments improve the performance of a computer carrying out electronic design analysis (EDA) by removing the need to re-run the simulations when the AT changes—the AT changes but the RAT does not.

Given the discussion thus far, it will be appreciated that, in general terms, an exemplary method, according to an aspect of the invention, includes the step of computing, for an out-of-context victim net 304 (on an in-context victim path 303) of an integrated circuit design, coupled noise (e.g. via 317) from at least one out-of-context aggressor net 302 (on an in-context aggressor path 301) of the integrated circuit design. The out-of-context victim net and the at least one out-of-context aggressor net are out-of-context with respect to a hierarchical noise analysis of the integrated circuit design, as described elsewhere herein. Furthermore in this regard, in one or more embodiments the victim and aggressor net(s) are both part of the out-of-context hierarchical component of the design. However, either or both are continuations of paths which extend to in-context component(s) of the design (i.e. beyond the hierarchical component being analyzed). As used herein, a "path" is a chain of nets; in other words, net-device-net-device-etc. Thus, the timing (arrival times) on these nets are affected by the in-context component, which is not fully known.

In FIG. 3, the dashed box is a boundary; inside the box is a low level in the hierarchy (out of context); outside the box is a high level in the hierarchy (in context). One or more embodiments are directed to analyzing the elements inside of the box; however, the lines extend outside of the box, which causes issues addressed herein. Consider coupling 317. What is effectively being analyzed in one or more embodiments is the line between the buffers 311, 313 (aggressor net) and the line between the buffers 305, 307 (victim net) and the coupling 317 between them. Both the victim and aggressor nets are out of context. However, both of these out-of-context nets are on in-context paths; i.e., they are coupled to in-context components and the timing is thus dependent on the in-context data. One or more embodiments compensate for this issue. One or more embodiments address a scenario where the victim and aggressor nets are both out of context but where one or both of them lie on in-context paths. The step of computing the coupled noise, as noted, can be carried out using known techniques. U.S. Pat. No. 9,542,524 of Gregerson et al., hereby expressly incorporated herein by reference in its entirety for all purposes, describes the idea of abstracting (analyzing as a stand-alone component) an out-of-context design and applying that "abstract" to the in-context analysis (not specific to noise, but timing analysis in general).

As seen in FIG. 3, further steps include deriving, for the at least one out-of-context aggressor net, an aggressor signal timing window; and deriving, for the out-of-context victim net, a victim signal timing window. An even further step includes completing a timing window and noise analysis with the aggressor signal timing window and the victim signal timing window, using known techniques. U.S. Pat. No. 6,510,540 describes the basic idea of window analysis applied to coupled noise analysis. One or more embodiments define specific timing windows to be used by the technique described in U.S. Pat. No. 6,510,540.

The aggressor signal timing window is derived as a function of required arrival time of the at least one out-of-context aggressor net (func($RAT_{Agg}$)) and/or the victim signal timing window is derived as a function of required arrival time of the out-of-context victim net (func($RAT_{Vic}$)). Furthermore in this regard, in some cases, the aggressor signal timing window is not derived as a function of the required arrival time of the at least one out-of-context aggressor net but the victim signal timing window is derived as a function of the required arrival time of the out-of-context victim net; while in other cases, the aggressor signal timing window is derived as a function of the required arrival time of the at least one out-of-context aggressor net but the victim signal timing window is not derived as a function of the required arrival time of the out-of-context victim net. In one or more embodiments, the aggressor signal timing window is derived as a function of the required arrival time of the at least one out-of-context aggressor net and the victim signal timing window is derived as a function of the required arrival time of the out-of-context victim net.

In some cases, deriving the aggressor signal timing window includes determining a range of earliest to latest arrival times satisfying the required arrival time of the at least one out-of-context aggressor net. Refer to FIG. 4 and accompanying discussion.

In some cases, when deriving the victim signal timing window, the victim signal timing window is based on a worst-case arrival time within a range of earliest to latest possible arrival times that satisfy the required arrival time of the out-of-context victim net. Refer to FIG. 5 and accompanying discussion.

Of course, in some instances there may be more than one out-of-context aggressor net. So, for example, the at least one out-of-context aggressor net could include a first out-of-context aggressor net and at least one additional out-of-context aggressor net; the step of deriving the aggressor signal timing window then includes deriving an aggressor signal timing window for the first out-of-context aggressor net and deriving an aggressor signal timing window for the at least one additional out-of-context aggressor net.

In at least some such instances, the required arrival time of the at least one out-of-context aggressor net includes a required arrival time for the first out-of-context aggressor net and a required arrival time for the at least one additional out-of-context aggressor net. Where there are multiple out-of-context aggressor nets, the timing windows for any one, some, or all could be determined in accordance with aspects of the invention as described herein, while different techniques could be used for others if desired. Thus, in a non-limiting example, the aggressor signal timing window for the first out-of-context aggressor net is derived as a function of the required arrival time of the first out-of-context aggressor net; and the aggressor signal timing window for the at least one additional out-of-context aggressor net is not derived as a function of the required arrival time for the at least one additional out-of-context aggressor net.

In one or more embodiments, when the actual arrival time associated with the at least one in-context portion of the integrated circuit design changes, there is no need to re-run the analysis, thus improving the performance of a computer implementing the method (less CPU time, e.g., as compared to prior art). One or more embodiments thus refrain from re-running the computing, deriving the aggressor signal timing window, deriving the victim signal timing window, and completing the timing window and noise analysis steps when the actual arrival time associated with the at least one in-context portion of the integrated circuit design changes.

Figure 7:
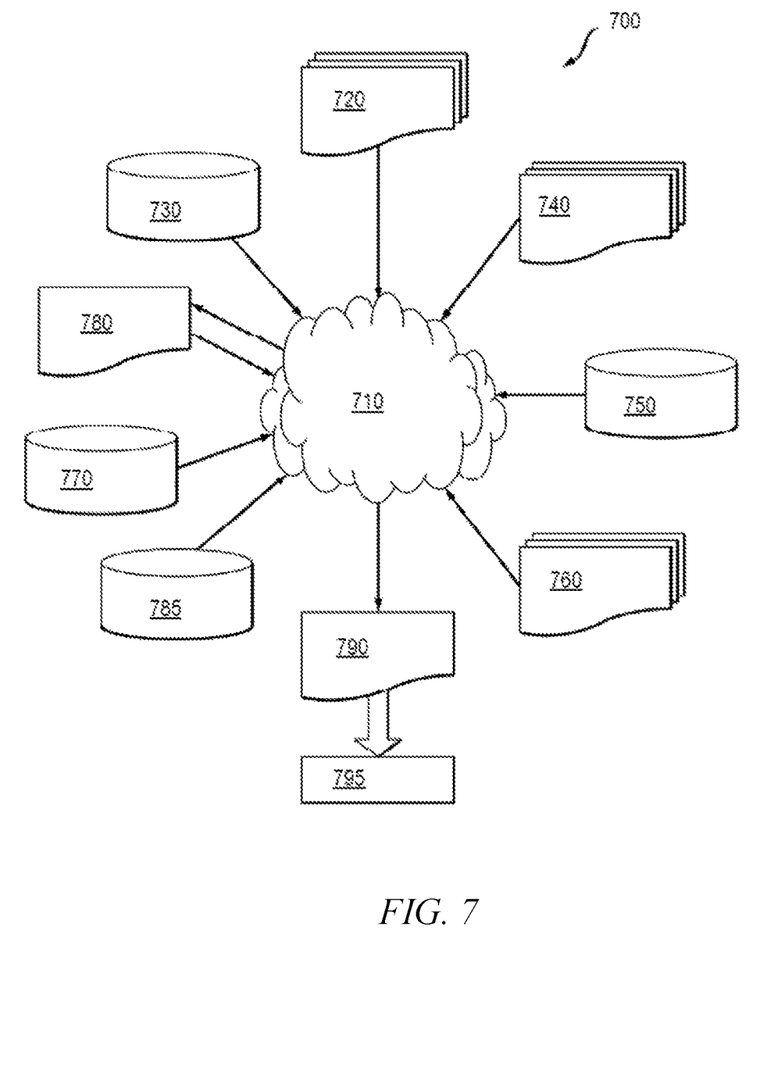
FIG. 7 is a flow diagram of a design process used in semiconductor design, manufacture, and/or test.
Figure 8:
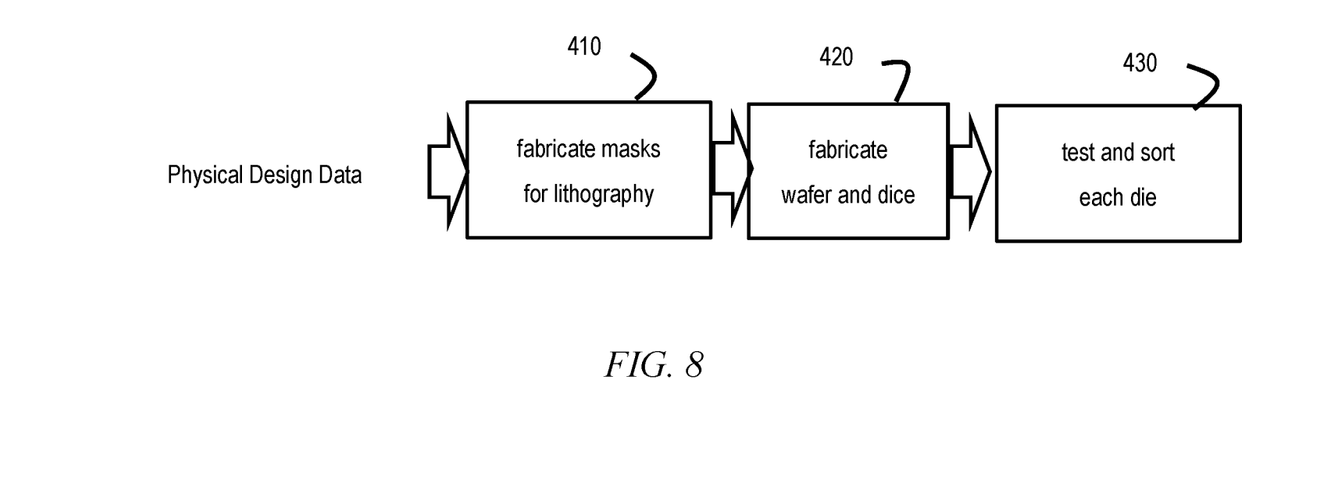
FIG. 8 shows further aspects of IC fabrication from physical design data.

Referring to the discussion of FIG. 7 elsewhere herein, one or more embodiments generate a design structure (e.g. 790) for the integrated circuit design in accordance with the timing window and noise analysis. In such cases, a further step in one or more embodiments includes fabricating a physical integrated circuit in accordance with the design structure. Referring now also to FIG. 8, once the physical design data is obtained, based, in part, on the improved timing analysis disclosed herein, an integrated circuit can be fabricated according to known processes that are generally described with reference to FIG. 8. Generally, a wafer with multiple copies of the final design is fabricated and cut (i.e., diced) such that each die is one copy of the integrated circuit. At block 410, the processes include fabricating masks for lithography based on the finalized physical layout. At block 420, fabricating the wafer includes using the masks to perform photolithography and etching. Once the wafer is diced, testing and sorting each die is performed to filter out any faulty die, as at step 430.

Figure 6:
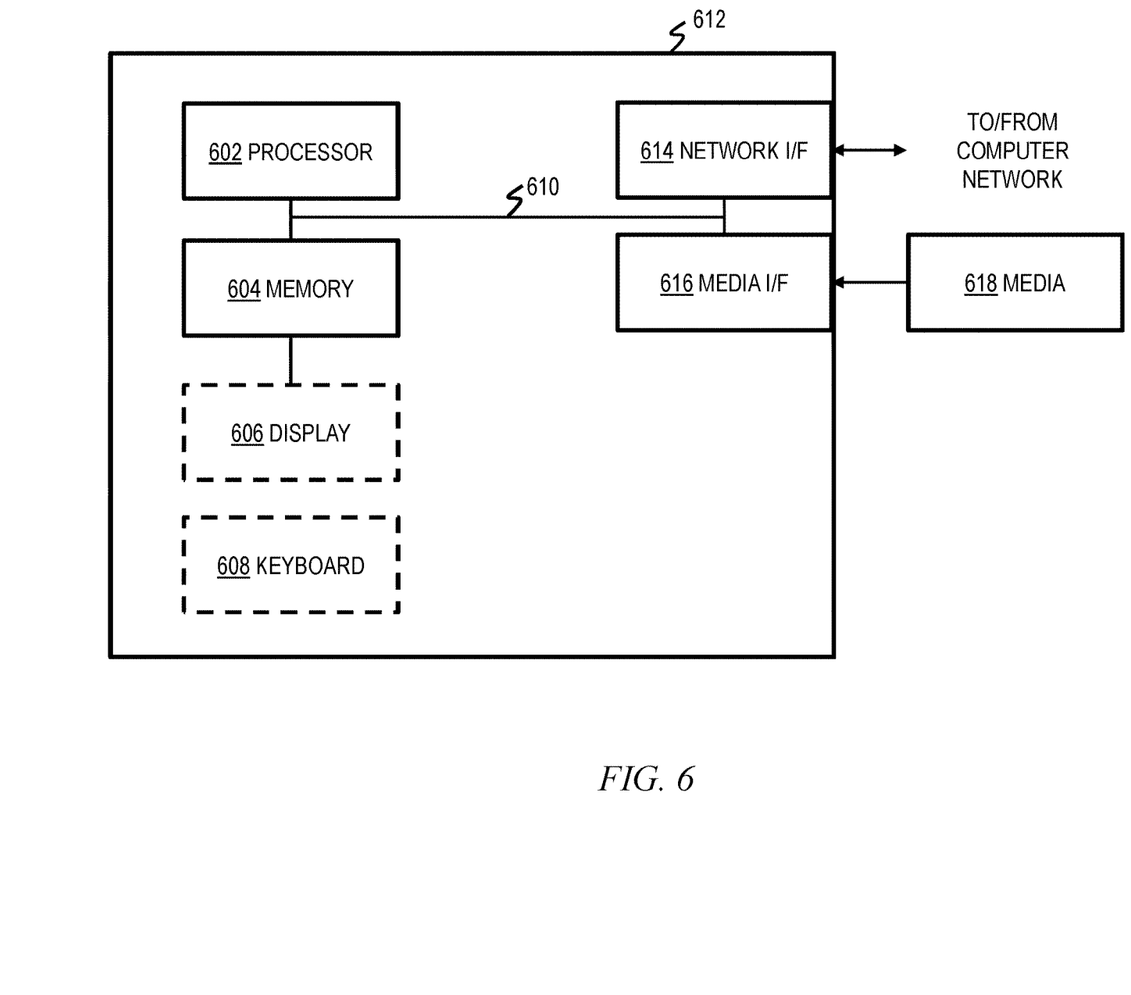
FIG. 6 depicts a computer system that may be useful in implementing one or more aspects and/or elements of the invention.

One or more embodiments include an apparatus including a memory 604; and at least one processor 602, coupled to the memory, and operative to carry out or otherwise facilitate any one, some, or all of the method steps described herein. In one or more embodiments, the performance of this processor is improved by refraining from re-running the computing, deriving the aggressor signal timing window, deriving the victim signal timing window, and completing the timing window and noise analysis steps when the actual arrival time associated with the at least one in-context portion of the integrated circuit design changes, as described elsewhere herein. Furthermore, referring to FIG. 7, in one or more embodiments the at least one processor is operative to generate a design structure for the integrated circuit design in accordance with the timing window and noise analysis, and in at least some embodiments, the at least one processor is further operative to control integrated circuit manufacturing equipment to fabricate a physical integrated circuit in accordance with the design structure.

Exemplary System

One or more embodiments of the invention, or elements thereof, can be implemented in the form of an apparatus including a memory and at least one processor that is coupled to the memory and operative to perform exemplary method steps.

One or more embodiments can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules/routines and/or sub-modules/subroutines of the system, as described above, executing on one or more hardware processors 602. Further, a computer program product as described below can include code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

Computer Program Products

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the timing analysis techniques herein with semiconductor integrated circuit design simulation, test, layout, and/or manufacture. In this regard, FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved timing analysis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
  computing, for an out-of-context victim net of an integrated circuit design, coupled noise from at least one out-of-context aggressor net of said integrated circuit design, said out-of-context victim net and said at least one out-of-context aggressor net being out-of-context with respect to a hierarchical noise analysis of said integrated circuit design, at least one of said out-of-context victim net and said at least one out-of-context aggressor net being a continuation of a path which extends to at least one in-context portion of said integrated circuit design;

deriving, for said at least one out-of-context aggressor net, an aggressor signal timing window;

deriving, for said out-of-context victim net, a victim signal timing window; and completing a timing window and noise analysis with said aggressor signal timing window and said victim signal timing window;

wherein said aggressor signal timing window is derived as a function of required arrival time of said at least one out-of-context aggressor net and/or said victim signal timing window is derived as a function of required arrival time of said out-of-context victim net.

2. The method of claim 1, wherein said aggressor signal timing window is not derived as a function of said required arrival time of said at least one out-of-context aggressor net but said victim signal timing window is derived as a function of said required arrival time of said out-of-context victim net.

3. The method of claim 1, wherein said aggressor signal timing window is derived as a function of said required arrival time of said at least one out-of-context aggressor net but said victim signal timing window is not derived as a function of said required arrival time of said out-of-context victim net.

4. The method of claim 1, wherein said aggressor signal timing window is derived as a function of said required arrival time of said at least one out-of-context aggressor net and said victim signal timing window is derived as a function of said required arrival time of said out-of-context victim net.

5. The method of claim 4, wherein deriving said aggressor signal timing window comprises determining a range of earliest to latest arrival times satisfying said required arrival time of said at least one out-of-context aggressor net.

6. The method of claim 4, wherein, in said deriving of said victim signal timing window, said victim signal timing window is based on a worst-case arrival time within a range of earliest to latest possible arrival times that satisfy said required arrival time of said out-of-context victim net.

7. The method of claim 1, wherein:

said at least one out-of-context aggressor net comprises a first out-of-context aggressor net and at least one additional out-of-context aggressor net; and said step of deriving said aggressor signal timing window comprises deriving an aggressor signal timing window for said first out-of-context aggressor net and deriving an aggressor signal timing window for said at least one additional out-of-context aggressor net.

8. The method of claim 7, wherein:

said required arrival time of said at least one out-of-context aggressor net comprises a required arrival time for said first out-of-context aggressor net and a required arrival time for said at least one additional out-of-context aggressor net;

said aggressor signal timing window for said first out-of-context aggressor net is derived as a function of said required arrival time of said first out-of-context aggressor net; and said aggressor signal timing window for said at least one additional out-of-context aggressor net is not derived as a function of said required arrival time for said at least one additional out-of-context aggressor net.

9. The method of claim 1, wherein an actual arrival time associated with said at least one in-context portion of said integrated circuit design changes, further comprising improving the performance of a computer implementing said method by refraining from re-running said computing, deriving said aggressor signal timing window, deriving said victim signal timing window, and completing said timing window and noise analysis steps when said actual arrival time associated with said at least one in-context portion of said integrated circuit design changes.

10. The method of claim 1, further comprising:

generating a design structure for said integrated circuit design in accordance with said timing window and noise analysis.

11. The method of claim 10, further comprising fabricating a physical integrated circuit in accordance with said design structure.

12. A non-transitory computer readable medium comprising computer executable instructions which when executed by a computer cause the computer to perform a method of:

computing, for an out-of-context victim net of an integrated circuit design, coupled noise from at least one out-of-context aggressor net of said integrated circuit design, said out-of-context victim net and said at least one out-of-context aggressor net being out-of-context with respect to a hierarchical noise analysis of said integrated circuit design, at least one of said out-of-context victim net and said at least one out-of-context aggressor net being a continuation of a path which extends to at least one in-context portion of said integrated circuit design;

deriving, for said at least one out-of-context aggressor net, an aggressor signal timing window;

deriving, for said out-of-context victim net, a victim signal timing window; and completing a timing window and noise analysis with said aggressor signal timing window and said victim signal timing window;

wherein said aggressor signal timing window is derived as a function of required arrival time of said at least one out-of-context aggressor net and/or said victim signal timing window is derived as a function of required arrival time of said out-of-context victim net.

13. The non-transitory computer readable medium of claim 12, wherein said aggressor signal timing window is not derived as a function of said required arrival time of said at least one out-of-context aggressor net but said victim signal timing window is derived as a function of said required arrival time of said out-of-context victim net.

14. The non-transitory computer readable medium of claim 12, wherein said aggressor signal timing window is derived as a function of said required arrival time of said at least one out-of-context aggressor net but said victim signal timing window is not derived as a function of said required arrival time of said out-of-context victim net.

15. The non-transitory computer readable medium of claim 12, wherein said aggressor signal timing window is derived as a function of said required arrival time of said at least one out-of-context aggressor net and said victim signal timing window is derived as a function of said required arrival time of said out-of-context victim net.

16. An apparatus comprising:

a memory; and at least one processor, coupled to said memory, and operative to:

compute, for an out-of-context victim net of an integrated circuit design, coupled noise from at least one out-of-context aggressor net of said integrated circuit design, said out-of-context victim net and said at least one out-of-context aggressor net being out-of-context with respect to a hierarchical noise analysis of said integrated circuit design, at least one of said out-of-context victim net and said at least one out-of-context aggressor net being a continuation of a path which extends to at least one in-context portion of said integrated circuit design;

derive, for said at least one out-of-context aggressor net, an aggressor signal timing window;

derive, for said out-of-context victim net, a victim signal timing window; and complete a timing window and noise analysis with said aggressor signal timing window and said victim signal timing window;

wherein said aggressor signal timing window is derived as a function of required arrival time of said at least one out-of-context aggressor net and/or said victim signal timing window is derived as a function of required arrival time of said out-of-context victim net.

17. The apparatus of claim 16, wherein said aggressor signal timing window is derived by said at least one processor as a function of said required arrival time of said at least one out-of-context aggressor net and said victim signal timing window is derived by said at least one processor as a function of said required arrival time of said out-of-context victim net.

18. The apparatus of claim 16, wherein an actual arrival time associated with said at least one in-context portion of said integrated circuit design changes, wherein performance of said at least one processor is improved by refraining from re-running said computing, deriving said aggressor signal timing window, deriving said victim signal timing window, and completing said timing window and noise analysis steps when said actual arrival time associated with said at least one in-context portion of said integrated circuit design changes.

19. The apparatus of claim 16, wherein said at least one processor is further operative to:

generate a design structure for said integrated circuit design in accordance with said timing window and noise analysis.

20. The apparatus of claim 19, wherein said at least one processor is further operative to control integrated circuit manufacturing equipment to fabricate a physical integrated circuit in accordance with said design structure.

* * * * *